(12) United States Patent
Hsu et al.

(10) Patent No.: US 10,249,778 B2
(45) Date of Patent: Apr. 2, 2019

(54) SOLAR CELL STRUCTURE FOR WIRELESS CHARGING

(71) Applicant: Industrial Technology Research Institute, Hsinchu (TW)

(72) Inventors: Hung-Ru Hsu, Changhua County (TW); Li-Chih Chang, Kaohsiung (TW); Tung-Po Hsieh, Taipei (TW); Yeong-Lin Lai, Taoyuan (TW); Ang-Lun Lee, Chiayi (TW)

(73) Assignee: Industrial Technology Research Institute, Hsinchu (TW)

( * ) Notice: Subject to any disclaimer, the term of this patent is extended or adjusted under 35 U.S.C. 154(b) by 153 days.

(21) Appl. No.: 14/985,364

(22) Filed: Dec. 30, 2015

(65) Prior Publication Data

US 2017/0162735 A1 Jun. 8, 2017

(30) Foreign Application Priority Data

Dec. 4, 2015 (TW) .............................. 104140846 A

(51) Int. Cl.
*H01L 31/0465* (2014.01)
*H01L 31/053* (2014.01)
(Continued)

(52) U.S. Cl.
CPC .. *H01L 31/0465* (2014.12); *H01L 31/022425* (2013.01); *H01L 31/022433* (2013.01); *H01L 31/022441* (2013.01); *H01L 31/022475* (2013.01); *H01L 31/022483* (2013.01); *H01L 31/048* (2013.01); *H01L 31/053* (2014.12);
(Continued)

(58) Field of Classification Search
CPC ... H01L 31/0465; H01L 31/053; H02S 10/10; H02J 50/12
See application file for complete search history.

(56) References Cited

U.S. PATENT DOCUMENTS

| | | | | |
|---|---|---|---|---|
| 6,326,764 B1 * | 12/2001 | Virtudes | ................. | H02J 7/355 320/101 |
| 6,756,765 B2 * | 6/2004 | Bruning | ................. | H02J 7/025 320/108 |

(Continued)

FOREIGN PATENT DOCUMENTS

| CN | 102355163 | 2/2012 |
|---|---|---|
| CN | 102414957 | 4/2012 |

(Continued)

OTHER PUBLICATIONS

Shinohara et al., "Recent Wireless Power Transmission Technologies in Japan for Space Solar Power Station/Satellite," RWS '09. IEEE Radio and Wireless Symposium, Jan. 2009, pp. 13-15.

(Continued)

*Primary Examiner* — Tae-Sik Kang
(74) *Attorney, Agent, or Firm* — JCIPRNET

(57) ABSTRACT

A solar cell structure for wireless charging includes a substrate and at least one thin film solar cell disposed on a surface of the substrate, wherein the thin film solar cell has a winding coil structure. Accordingly, in the thin film solar cell, the electrode which is the winding coil structure may be used as electromagnetic induction coil or millimeter-wave radio wave receiving radiator.

15 Claims, 9 Drawing Sheets

(51) Int. Cl.
*H02S 10/10* (2014.01)
*H02J 50/12* (2016.01)
*H01L 31/0224* (2006.01)
*H01L 31/048* (2014.01)
*H01L 31/0749* (2012.01)
*H02J 7/35* (2006.01)
*H02J 50/00* (2016.01)

(52) U.S. Cl.
CPC ....... *H01L 31/0749* (2013.01); *H02J 50/12* (2016.02); *H02S 10/10* (2014.12); *H02J 7/355* (2013.01); *H02J 50/00* (2016.02); *Y02E 10/541* (2013.01)

(56) References Cited

U.S. PATENT DOCUMENTS

| | | | |
|---|---|---|---|
| 7,952,322 B2 | 5/2011 | Partovi et al. | |
| 8,159,090 B2 | 4/2012 | Greene et al. | |
| 8,629,654 B2 | 1/2014 | Partovi et al. | |
| 8,947,047 B2 | 2/2015 | Partovi et al. | |
| 2010/0206381 A1* | 8/2010 | Aida | H01L 31/0749 136/261 |
| 2010/0326429 A1* | 12/2010 | Cumpston | H01L 31/035281 126/710 |
| 2011/0017289 A1* | 1/2011 | Park | H01L 31/0236 136/256 |
| 2014/0111135 A1 | 4/2014 | Idzik et al. | |
| 2014/0145634 A1 | 5/2014 | Sullivan et al. | |
| 2015/0145634 A1 | 5/2015 | Kurz et al. | |
| 2015/0221785 A1* | 8/2015 | Cheng | H01L 31/02021 136/244 |

FOREIGN PATENT DOCUMENTS

| | | |
|---|---|---|
| CN | 103077986 | 5/2013 |
| CN | 103280859 | 9/2013 |
| CN | 103366916 | 10/2013 |
| CN | 104836522 | 8/2015 |
| TW | M439946 | 10/2012 |
| TW | 201431101 | 8/2014 |
| TW | M485504 | 9/2014 |
| TW | 201444104 | 11/2014 |
| TW | 201523660 | 6/2015 |

OTHER PUBLICATIONS

Danesh et al., "An Autonomous Wireless Sensor Node Incorporating a Solar Cell Antenna for Energy Harvesting," IEEE Transactions on Microwave Theory and Techniques, Dec. 2011, pp. 3546-3555.

Huang et al., "Integrated All-silicon Thin-film Power Electronics on Flexible Sheets for Ubiquitous Wireless Charging Stations based on Solar-energy Harvesting," 2012 Symposium on VLSI Circuits (VLSIC), Jun. 2012, pp. 198-199.

Park et al., "AmbiMax: Autonomous Energy Harvesting Platform for Multi-Supply Wireless Sensor Nodes," IEEE Communications Society on Sensor and Ad Hoc Communications and Networks, Sep. 2006, pp. 168-177.

Li et al., "Hybrid Micropower Source for Wireless Sensor Network," IEEE Sensors Journal, Jun. 2008, pp. 678-681.

"Office Action of Taiwan Counterpart Application", dated May 26, 2016, p. 1-p. 5.

"Office Action of China Counterpart Application," dated Dec. 25, 2017, p. 1-p. 8.

* cited by examiner

SOLAR CELL STRUCTURE FOR WIRELESS CHARGING

CROSS-REFERENCE TO RELATED APPLICATION

This application claims the priority benefit of Taiwan application no. 104140846, filed on Dec. 4, 2015. The entirety of the above-mentioned patent application is hereby incorporated by reference herein and made a part of this specification.

TECHNICAL FIELD

The disclosure is related to a solar cell structure for wireless charging.

BACKGROUND

In recent years, along with the evolution of miniaturization technologies of 3C electronic products, portable products, such as mobile phone, tablet PC, smart glasses, wearable devices, etc., are gradually integrated into human daily life so as to make the human daily life more and more convenient. In addition, maintaining the electrical energy to operate the electronic product is the most critical subject. However, when the electronic products are used in a long time, the electricity is gradually consumed, so as to limit the range of application and convenience of the electronic products. Along with the rise of the mobile wearable devices, how to improve battery life and minimize the entirety of the mechanical design is the biggest problem that the portable electronic products will face in the future.

In the 3C electronic device systems currently available in the market, the energy harvesting techniques can be roughly divided into solar cell technology and wireless charging technology. The solar cell can use sunlight and ambient light to perform energy harvesting, however, in the environment without sunlight, the working efficiency of the solar cell is very low; the electromagnetic induction technology uses the characteristic that electromagnetic wave transforming to energy to perform energy harvesting, but inductive coupling is only used in a short distance to harvest energy; Although the millimeter-wave wireless charging technology may elongate the induction distance of the wireless charging, the harvest energy is lowest in three technologies.

SUMMARY

One embodiment of the disclosure comprises a solar cell structure for wireless charging including a substrate, at least a thin film solar cell disposed on a surface of the substrate. The thin film solar cell has a winding coil structure.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
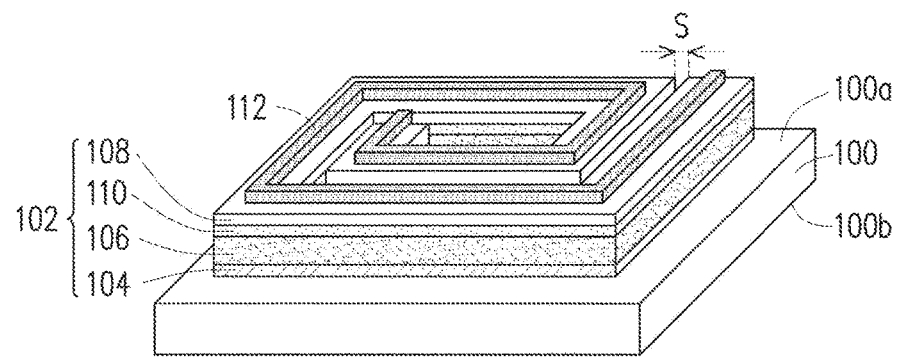
FIG. 1A is a schematic view of a solar cell structure for wireless charging according to an exemplary embodiment of the disclosure.

The following is detailed description of the embodiments with reference to the accompanying drawings. It should be noted here, the description and the drawings are used for depicting the embodiments and are not used for limiting scope of the disclosure; In order to describe easily, the embodiments are not sized to the actual proportion in the drawings.

FIG. 1A is a schematic view of a solar cell structure for wireless charging according to an exemplary embodiment of the disclosure.

Referring to FIG. 1A, the solar cell structure for wireless charging includes a substrate 100 and a thin film solar cell 102. The thin film solar cell 102 having a winding coil structure is disposed on the first surface 100a of the substrate 100. The term "winding coil structure" indicates a current connected structure having winding shape and having two ends. The detailed structure of the thin film solar cell 102 of the present embodiment is not specifically restricted, for example, the thin film solar cell 102 has a back electrode 104, a light absorption layer 106 formed on the back electrode 104, and a transparent electrode layer 108 formed on the light absorption layer 106, etc., and a buffer layer 110 is disposed between the light absorption layer 106 and transparent electrode layer 108. Otherwise, a metal conductive line 112 (also known as "Grid") is disposed on the transparent electrode layer 108 to collect the current. Since the thin film solar cell 102 has the winding coil structure, wherein each of the layers therein is also a winding coil structure. In other words, the back electrode 104 and the metal conductive line 112 both present the winding coil structure, so as to be able to serve as magnetic induction electrodes for wireless charging. Alternatively, a winding coil structure having appropriate frequency band is designed on the first surface 100a of the substrate 100 to serve as the back electrode 104, so as to be able to absorb magnetic coupling energy, and the substrate 100 serves as the material for transmitting electromagnetic wave. A spacing S between lines of the thin film solar cell 102 is greater than 30 μm and preferably between 30 μm~100 μm, for example.

In the present embodiment, the substrate 100 may be a glass substrate, a flexible substrate (such as PI or other appropriate materials), a dielectric substrate, or a metal substrate, for example; The back electrode 104 is molybdenum, copper, aluminum, fluorine tin oxide (FTO), aluminum zinc oxide (AZO), or indium tin oxide (ITO), for example. The transparent electrode layer 108 is AZO, ITO or FTO, for example; the buffer layer 110 may be used as n-type layer, and the material of the buffer layer 110 includes CdS, a-Si (amorphous silicon), $TiO_2$, ZnS, ZnO, MgZnO or $In_2S_3$. In addition, the thin film solar cell 102 may be CIGS thin film solar cell, CdTe thin film solar cell, silicon (a-Si) thin film solar cell, perovskite thin-film solar cell, or dye-sensitized solar cell (DSSC).

CIGS thin film solar cell is exemplified as the thin film solar cell 102 in the present embodiment, and it may be fabricated according to the following production process, but the disclosure is not limited thereto. Firstly, a soda glass is used as the substrate, and then a molybdenum (Mo) metal layer is deposited to serve as the back electrode. Next, CIG metal precursor is deposited on the Mo electrode by sputtering, and the sulfurization after selenization (SAS) process is then performed through $H_2Se$ and $H_2S$ gas, so as to form p-type $Cu(Ga, In)Se_2$ light absorption layer after high temperature reaction process. The chemical bath deposition (CBD) is performed to deposit a n-type cadmium sulfide (CdS) layer on the light absorption layer to serve as a n-type buffer layer, after that, pure zinc oxide (i-ZnO) layer and aluminum-doped zinc oxide (ZnO:Al) layer are deposited by sputtering to serve as a transparent electrode layer (also known as TCO). The uppermost layer is sputtered nickel/aluminum (Ni/Al) metal conductive line which serves as Grid. Finally, the laser scribing method is used to form the winding coil structure of the thin film solar cell.

Figure 1B:
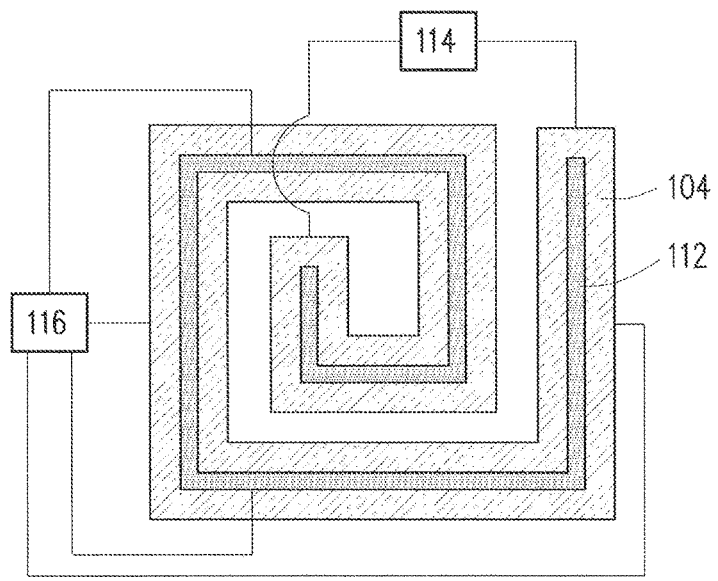
FIG. 1B is a schematic view illustrating a current transmitting part of FIG. 1A.

FIG. 1B is a simplified drawing of FIG. 1A, wherein most of the elements are omitted, and the back electrode 104 and the metal conductive line 112 (also known as the Grid) are retained to explain the illuminating and non-illuminating operations. When the thin film solar cell 102 in FIG. 1A is not illuminated, the thin film solar cell 102 receives power from external power supply equipment (not shown) to perform wireless charging, so as to charge or store energy for the energy storage device/portable device 114. In addition, when the thin film solar cell 102 in FIG. 1A is illuminated, the thin film solar cell 102 connects to the energy storage device/portable device 116 for performing charging or energy storage. The wires respectively connected to two electrodes (the back electrode 104 and the metal conductive line 112) of the thin film solar cell in FIG. 1B mat be increased or decreased according to the need. Otherwise, the energy stored by the energy storage device 114 or 116 may be used to perform millimeter wave charging for external devices.

Figure 2A:
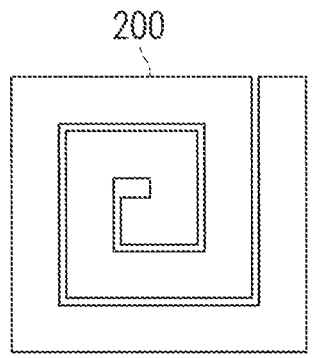
FIG. 2A to FIG. 2C are schematic views of several examples of modifying an electrode in FIG. 1A.
Figure 2B:
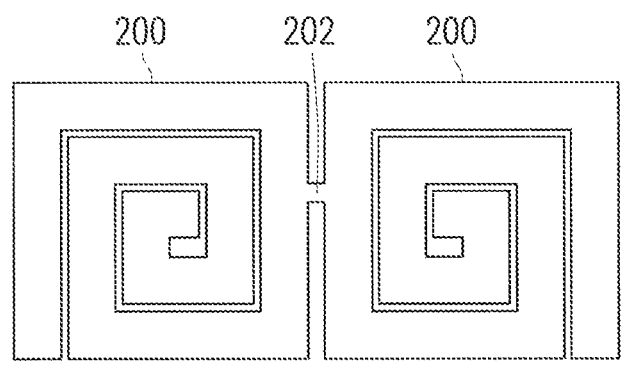
Figure 2C:
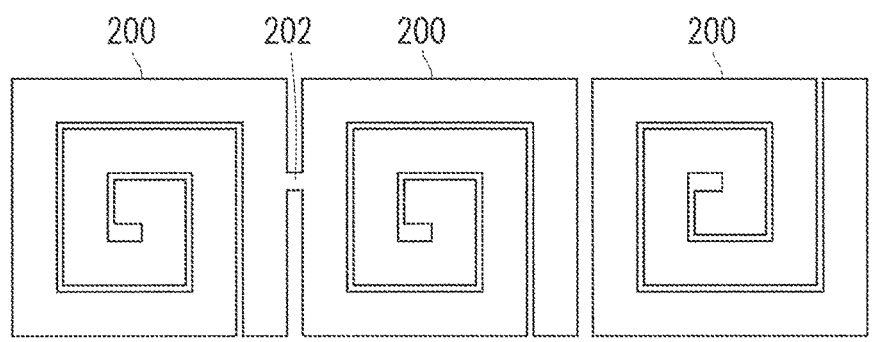

FIG. 2A to FIG. 2C are schematic views of several examples of modifying an electrode in FIG. 1A.

A coil 200 in FIG. 2A represents a back electrode of the thin film solar cell 102 in FIG. 1A and it may be charged by resonant magnetic induction or magnetic induction method. In particular, the induced electromotive force is generated in the coil 200 via the electromagnetic field generated by the induction coil of the external power supply equipment (not shown) and using resonant magnetic induction or magnetic flux induction method. In other words, the interaction caused by mutual inductance is generated in the power-supply coil and the coil 200 via resonant magnetic induction or magnetic coupling method. Therefore, power is supplied to the coil 200 side from the power-supply coil side. The coil 200 and the inductor-capacitor (LC) matching circuit (not shown) are utilized in LC resonant operation, and the LC resonant operation may transform the electromagnetic wave energy to the induced current. Subsequently, the charging operation is performed according to the power (AC power) received by the coil 200.

In FIG. 2B, there are two coils 200 having two thin film solar cells 102 as depicted in FIG. 1A, and the two coils 200 have an electrical signal connecting part 202 therebetween, so that the charging may be performed by receiving millimeter-wave. For example, the electrical signal connecting part 202 is between the electrodes of the two thin film solar cells. More specifically, the electrical signal connecting part 202 may serve as a signal receiving point, when the external power supply equipment (not shown) generate wireless signals (i.e. millimeter wave in a range of 30 GHz to 300 GHz), the coil 200 will receive the wireless signals and send to the impedance matching circuit, and the current is generated according to power from the impedance matching circuit so as to perform the charging operation. Beside the wireless signals having millimeter wave in a range of 30 GHz to 300 GHz, the coil 200 may also receive the wireless signals having submillimeter wave in a range of 300 GHz to 3 THz, microwave in a range of 3 GHz to 30 GHz, ultra high frequency wave in a range of 300 MHz to 3 GHz, very high frequency wave in a range of 30 MHz to 300 MHz, high-frequency wave in a range of 3 MHz to 30 MHz, intermediate wave in a range of 300 kHz to 3 MHz, low frequency wave in a range of 30 kHz to 300 kHz, or very low frequency wave in a range of 3 kHz to 30 kHz.

In FIG. 2C, there are three coils 200 having three thin film solar cells 102 as depicted in FIG. 1A, and two adjacent coils 200 have an electrical signal connecting part 202 therebetween, therefore, the device in FIG. 2C is able to have charging mode as described in FIG. 2A and FIG. 2B.

Figure 3:
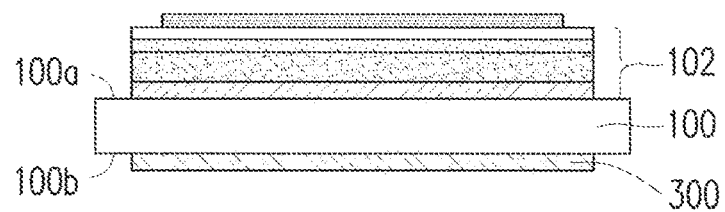
FIG. 3 is a schematic cross-sectional view of another solar cell structure for wireless charging according to an exemplary embodiment of the disclosure.

FIG. 3 is a schematic cross-sectional view of another solar cell structure for wireless charging according to an exemplary embodiment of the disclosure, wherein the same symbols of elements as in FIG. 1A are used to represent the same or similar elements.

In FIG. 3, beside the substrate 100 and the thin film solar cell 102, the solar cell structure for wireless charging further includes another winding coil structure 300 disposed on the substrate 100. The winding coil structure 300 is located on the surface 100b opposite to the thin film solar cell 102 and electrically connected to the LC matching circuit (not shown), so as to perform wireless charging.

The winding coil structure 300 may be fabricated after manufacturing the thin film solar cell 102. For example, a photomask is formed by an optimized L-C equivalent circuit design structure which is obtained by simulation, and then the equivalent circuit pattern is deposited on the back surface of the substrate 100 by sputtering different metal materials (such as Cu, Al, etc.) through the photomask, so that the needed winding coil structure is formed and then coupled to the external LC matching circuit.

Figure 4A:
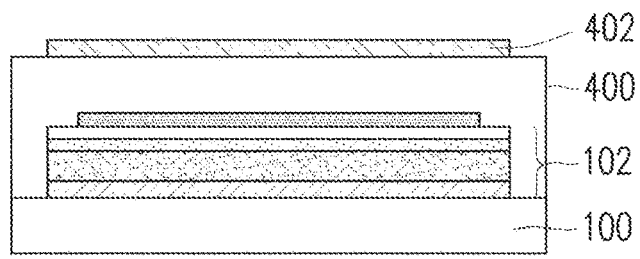
FIG. 4A and FIG. 4B are schematic cross-sectional views of solar cell structures for wireless charging according to other exemplary embodiments of the disclosure.
Figure 4B:
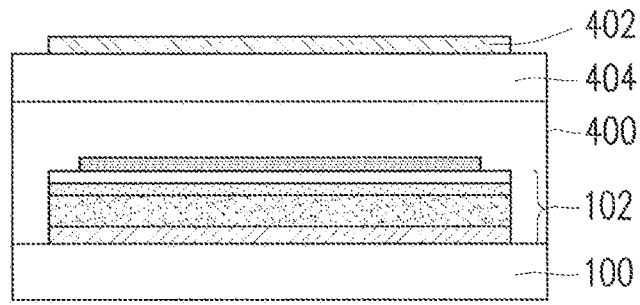

FIG. 4A and FIG. 4B are schematic cross-sectional views of solar cell structures for wireless charging according to other embodiments of the disclosure, wherein the same symbols of elements as in FIG. 1A are used to represent the same or similar elements.

In FIG. 4A, an encapsulation layer 400 on the substrate 100 covers the thin film solar cell 102, and a winding coil structure 402 is disposed on the encapsulation layer 400, and the manufacturing method of the winding coil structure 402 is the same as that of the winding coil structure 300. The winding coil structure 402 is formed on the encapsulation layer 400 by sputtering to deposit different metal materials through the photomask and coupled to the LC matching circuit, so as to generate induced current.

In FIG. 4B, the encapsulation layer 400 on the substrate 100 also covers the thin film solar cell 102, the difference between the embodiments in FIG. 4B and FIG. 4A is that a dielectric layer 404 (such as glass) is disposed on the encapsulation layer 400 and the winding coil structure 402 is disposed on the dielectric layer 404.

The actual production of an electrode with winding coil structure is described as follows, and the performance thereof is verified below.

Experimental Example 1

Figure 5:
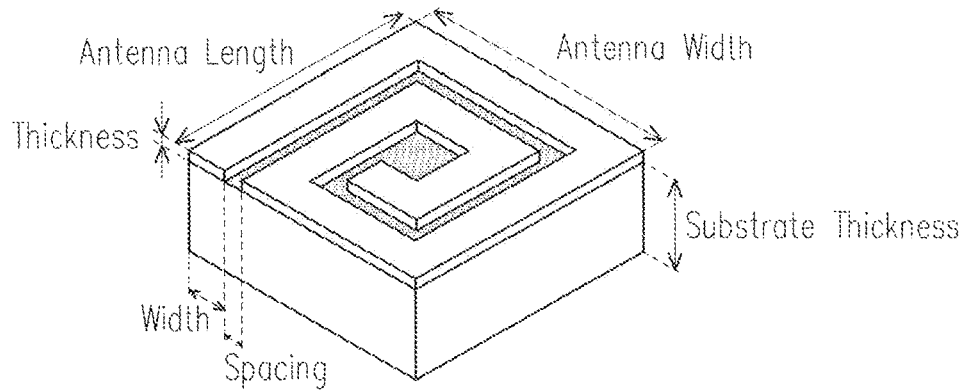
FIG. 5 is a schematic view of an electrode structure of an experimental example 1.

Firstly, a testing electrode structure is manufactured (namely, the back electrode of the thin film solar cell), the winding coil structure is shown in FIG. 5, the parameters are as follows:
Coil number: 3 segments;
Antenna length: 32 mm;
Antenna width: 32 mm;
Width (electrode): 5 mm;
Spacing (electrode): 0.1 mm;
Thickness (electrode): 0.035 mm;
Substrate thickness: 1 mm;
The permittivity of the substrate: 4.4.

Figure 6:
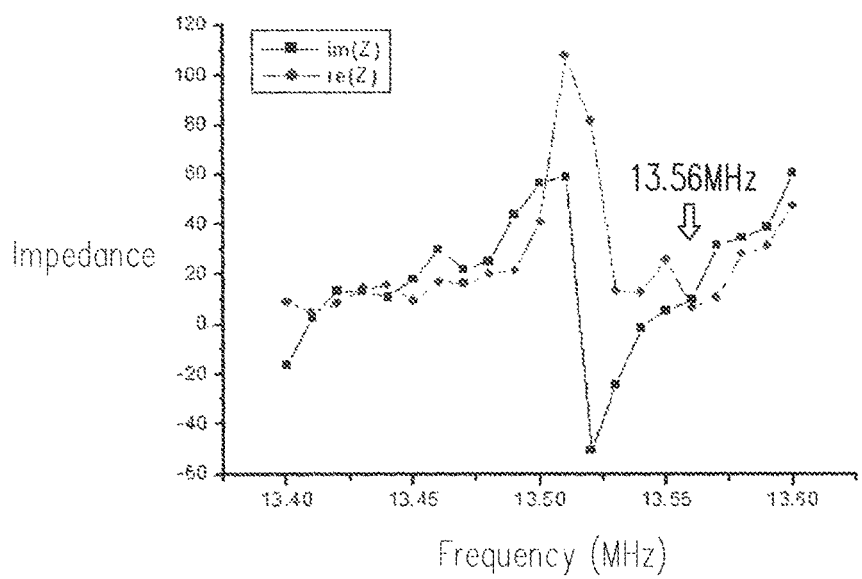
FIG. 6 is a curve graph illustrating the impedance in response to the frequency of AC current flowing through the electrode structure of the experimental example 1.

FIG. 6 is a curve graph illustrating the impedance in response to the frequency of alternating (AC) current flowing through the electrode structure of the experimental example 1. As shown in FIG. 6, at 13.56 MHz, the electromagnetic field induces the characteristic impedance of the coil, wherein f=13.56 MHz; Z=0.13+j4.16, and obtaining L=0.05 µH.

Figure 7A:
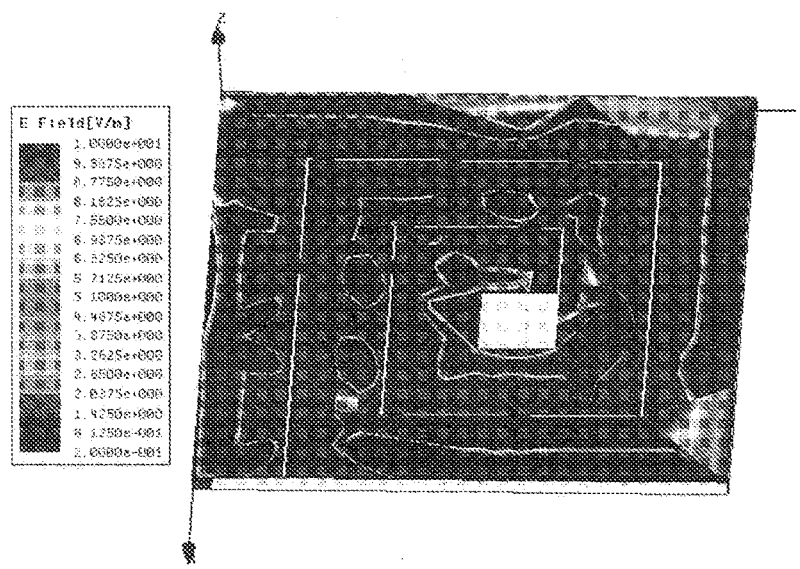
FIG. 7A is view of electric field distribution obtained on the surface of the electrode structure in the experimental example 1.
Figure 7B:
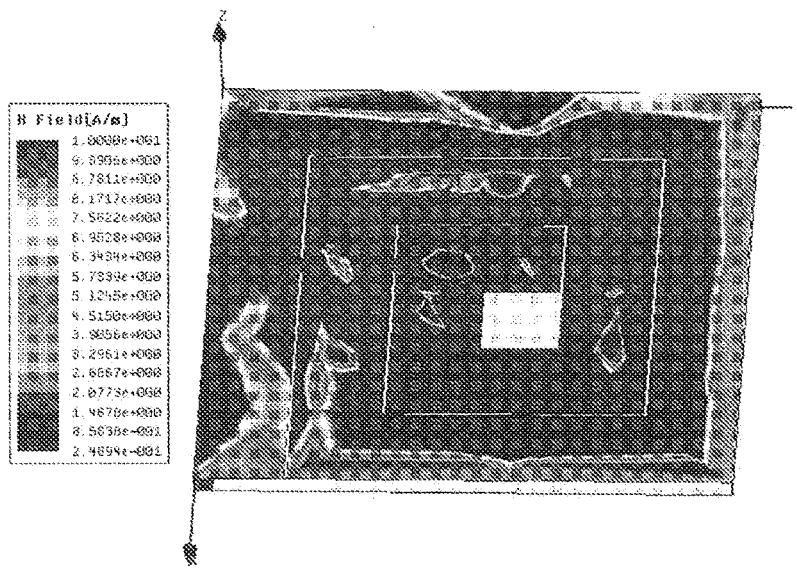
FIG. 7B is view of magnetic field distribution obtained on the surface of the electrode structure in the experimental example 1.

Otherwise, according to the electric field distribution (as shown in FIG. 7A) and the magnetic field distribution (as shown in FIG. 7B) obtained on the surface of the electrode structure in the experimental example 1, it can prove that the winding coil structure in FIG. 5 has induced magnetic field, and the charging can be performed via resonant magnetic induction method.

Experimental Example 2

Figure 8:
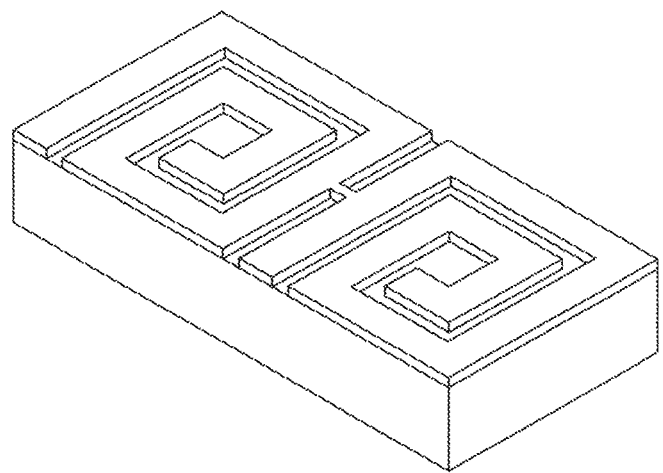
FIG. 8 is a schematic view of an electrode structure of an experimental example 2.

The experimental example 2 is also about measuring for a back electrode of the thin film solar cell, the back electrode shown in FIG. 8 is formed by two testing electrode structures as shown in FIG. 5, and the electrodes have the electrical signal connecting part therebetween to serve as the signal receiving point. The parameters of each of the winding coil structures in FIG. 8 are the same as those of the winding coil structure in experimental example 1.

Figure 9:
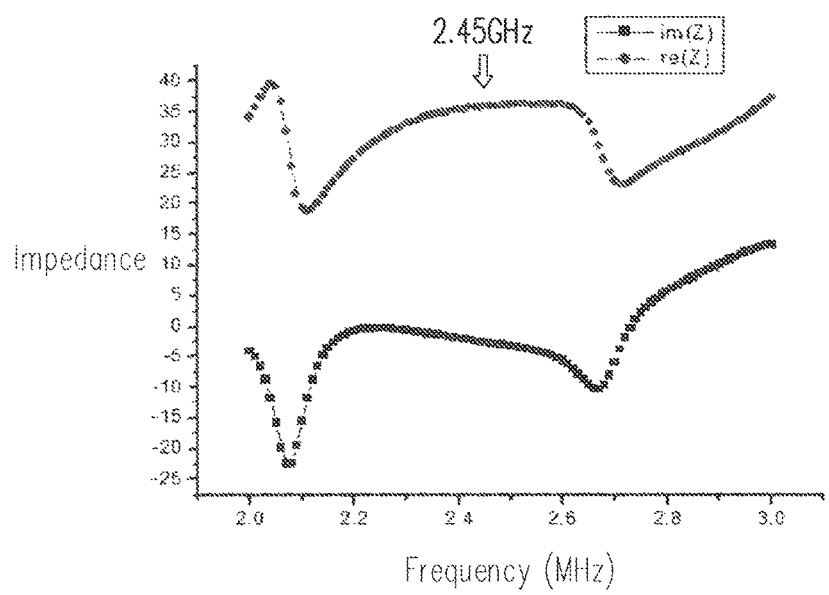
FIG. 9 is a curve graph illustrating the impedance in response to the frequency of AC current flowing through the electrode structure of the experimental example 2.
Figure 10:
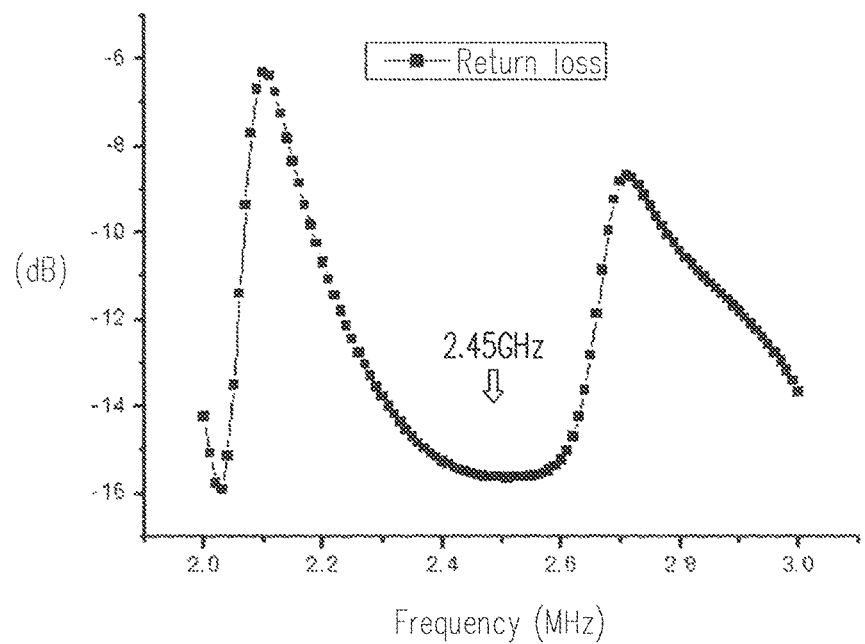
FIG. 10 is a curve graph of return loss in an experimental example 2.

FIG. 9 is a curve graph illustrating the impedance in response to the frequency of AC current flowing through the electrode structure of the experimental example 2. FIG. 10 is a curve graph of return loss in an experimental example 2. The characteristic impedance of the millimeter-wave radio wave receiving radiator and the return loss characteristic at 2.45 GHz are obtained in FIG. 9 and FIG. 10.

Figure 11:
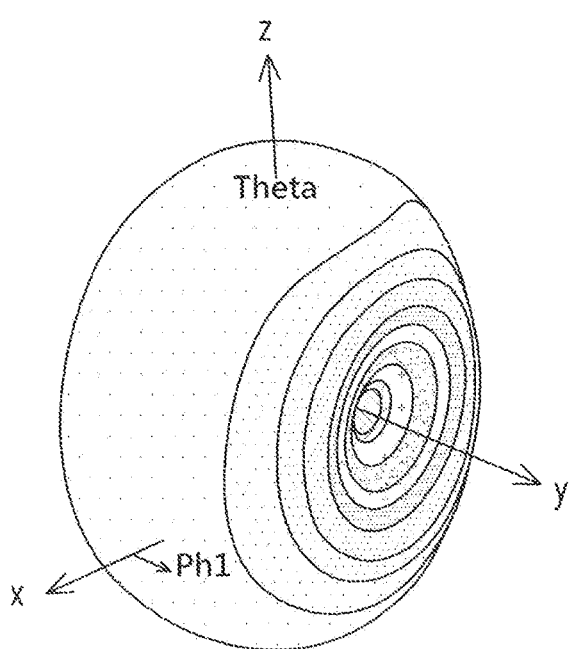
FIG. 11 is a view of antenna 3D radiation pattern of an induced electric field generated by the electrode structure in the experimental example 2.

According to the antenna 3D radiation pattern of induced electric field (as shown in FIG. 11) obtained by the electrode structure in the experimental example 2, it can prove that the winding coil structure in FIG. 7 is able to perform millimeter-wave charging.

In summary, the structures and the processes of the electromagnetic induction coil and the millimeter-wave radio wave receiving radiator are integrated into the thin film solar cell in the disclosure, and the substrate serves as required dielectric layer in electromagnetic wave energy coupling and conducting. Therefore, according to the disclosure, processes of current wireless charging induction coil, current millimeter-wave radio wave receiving radiator, and solar cell are combined to achieve the demand of reducing cost. Moreover, the solar cell structure may perform many types of energy harvesting at any moment, and be suitable for the charging equipment of the portable devices.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A solar cell structure for wireless charging, comprising:
   a plane substrate; and
   at least one thin film solar cell, disposed on a first surface of the plane substrate, wherein the at least one thin film solar cell has a first winding coil structure with two ends and having a central axis, the at least one thin film solar cell comprises:
   a back electrode, formed on the plane substrate;
   a light absorption layer, formed on the back electrode; and
   a transparent electrode layer, formed on the light absorption layer, wherein the back electrode, the light absorption layer, and the transparent electrode layer are the first winding coil structure, and the central axis of the first winding coil structure is perpendicular to the first surface of the plane substrate.

2. The solar cell structure for wireless charging of claim 1, wherein a number of the at least one thin film solar cell is two, and the solar cell structure further comprises an electrical signal connecting part between electrodes of the two thin film solar cells.

3. The solar cell structure for wireless charging of claim 1, wherein a number of the at least one thin film solar cell is three, and the solar cell structure further comprises an electrical signal connecting part between electrodes of the two adjacent thin film solar cells.

4. The solar cell structure for wireless charging of claim 1, further comprising an energy storage device connected to electrodes of the at least one thin film solar cell for energy storage.

5. The solar cell structure for wireless charging of claim 1, further comprising a second winding coil structure disposed on a second surface of the plane substrate.

6. The solar cell structure for wireless charging of claim 5, further comprising an inductor-capacitor (LC) matching circuit connected to the second winding coil structure.

7. The solar cell structure for wireless charging of claim 1, further comprising an encapsulation layer covering the at least one thin film solar cell, and a second winding coil structure is disposed on the encapsulation layer.

8. The solar cell structure for wireless charging of claim 1, wherein the plane substrate comprises glass substrate, flexible substrate, dielectric substrate, or metal substrate.

9. The solar cell structure for wireless charging of claim 1, wherein the back electrode comprises molybdenum, copper, aluminum, indium tin oxide (ITO), aluminum zinc oxide (AZO), or fluorine tin oxide (FTO).

10. The solar cell structure for wireless charging of claim 1, wherein the at least one thin film solar cell comprises CIGS thin film solar cell, CdTe thin film solar cell, silicon thin film solar cell, perovskite thin-film solar cell, or dye-sensitized solar cell.

11. The solar cell structure for wireless charging of claim 1, wherein the transparent electrode layer comprises aluminum zinc oxide (AZO), indium tin oxide (ITO), or fluorine tin oxide (FTO).

12. The solar cell structure for wireless charging of claim 1, wherein the at least one thin film solar cell further comprises a buffer layer located between the light absorption layer and the transparent electrode layer, and the buffer layer serves as a n-type layer.

13. The solar cell structure for wireless charging of claim 12, wherein a material of the buffer layer comprises CdS, amorphous silicon (a-Si) a-Si, $TiO_2$, ZnS, ZnO, MgZnO or $In_2S_3$.

14. The solar cell structure for wireless charging of claim 1, wherein the at least one thin film solar cell further comprises a metal conductive line disposed on the transparent electrode layer.

15. The solar cell structure for wireless charging of claim 7, further comprising an inductor-capacitor (LC) matching circuit connected to the second winding coil structure.

* * * * *